(12) United States Patent
Yang

(10) Patent No.: US 10,241,141 B2
(45) Date of Patent: Mar. 26, 2019

(54) APPARATUS FOR MEASURING RESISTANCE VALUE

(71) Applicants: Hyundai Motor Company, Seoul (KR); Kia Motors Corporation, Seoul (KR)

(72) Inventor: Sang Hyeok Yang, Suwon-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/673,828

(22) Filed: Aug. 10, 2017

(65) Prior Publication Data

US 2018/0164356 A1 Jun. 14, 2018

(30) Foreign Application Priority Data

Dec. 13, 2016 (KR) .................. 10-2016-0169726

(51) Int. Cl.
*G01R 27/14* (2006.01)
*G01R 35/00* (2006.01)

(52) U.S. Cl.
CPC ............. *G01R 27/14* (2013.01); *G01R 35/00* (2013.01); *G01R 35/005* (2013.01)

(58) Field of Classification Search
CPC ....... G01R 27/14; G01R 35/005; G01R 35/00

USPC .......... 324/705, 500, 549, 691, 727, 750.03, 324/750.06, 750.28, 670, 685, 721; 330/252, 257, 85, 107, 9, 174, 69; 327/106, 107, 307
See application file for complete search history.

(56) References Cited

U.S. PATENT DOCUMENTS

2016/0091543 A1* 3/2016 Hirai ...................... G01R 27/14
324/705
2016/0211031 A1* 7/2016 Taigor .................... G11C 16/28

FOREIGN PATENT DOCUMENTS

| JP | 2012-052986 A | 3/2012 |
| KR | 10-0746290 B1 | 7/2007 |
| KR | 10-1585231 B1 | 1/2016 |

* cited by examiner

*Primary Examiner* — Melissa J Koval
*Assistant Examiner* — Trung Nguyen
(74) *Attorney, Agent, or Firm* — Morgan, Lewis & Bockius LLP

(57) ABSTRACT

An apparatus for measuring resistance value may include a reference resistance including one end supplied with a first voltage and the other end connected with a target resistance; a variable voltage generating circuit for generating the first voltage varied according to temperature and supplying the first voltage to the one end of the reference resistance; and a signal processor for outputting resistance of the target resistance corresponding to a voltage outputted to the other end of the reference resistance.

7 Claims, 5 Drawing Sheets

APPARATUS FOR MEASURING RESISTANCE VALUE

CROSS-REFERENCE TO RELATED APPLICATION

The present application claims priority to Korean Patent Application No. 10-2016-0169726 filed on Dec. 13, 2016, the entire contents of which is incorporated herein for all purposes by this reference.

BACKGROUND OF THE INVENTION

Field of the Invention

The present invention relates to an apparatus for measuring resistance value.

Description of Related Art

In a measure circuit including a reference resistance for measuring resistance value, resistance value of the reference resistance may vary until 30% in accordance with a variation in ambient temperature. When the resistance value of the reference resistance is changed, error may occur. Therefore, to measure resistance, a circuit for compensating variation of the resistance value of the reference resistance in accordance with temperature is needed.

Conventional art uses a method that a method for previously recognizing resistance value depending on temperature, post-processing the measured resistance value based on the resistance value depending on temperature, and compensating the resistance value. However, according to the conventional art, measuring accuracy can be increased by error compensating of the measuring value, but there is a problem that complicated and a large-volume parts, e.g., ADC (Analog to Digital Converter), are required.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing an apparatus for measuring resistance value that can compensate error according to temperature of resistance and reduce complication.

An apparatus for measuring resistance value a may include a reference resistance including one end portion supplied with a first voltage and the other end portion connected to a target resistance; a variable voltage generating circuit for generating the first voltage varied according to temperature and supplying the first voltage to the one end portion of the reference resistance; and a signal processor for outputting resistance of the target resistance corresponding to a voltage outputted to the other end portion of the reference resistance.

The variable voltage generating circuit may include a temperature variable voltage generating circuit for varying a second voltage in accordance with temperature and outputting the second voltage; and an amplifier for amplifying an output voltage of the temperature variable voltage generating circuit to the first voltage and outputting the first voltage.

The apparatus may further include a bandgap reference circuit supplying the second voltage, wherein the temperature variable voltage generating circuit is a complementary to absolute temperature (CTAT) circuit of the bandgap reference circuit.

The temperature variable voltage generating circuit may output a voltage inversely proportional to temperature.

The amplifier may be an inverting amplifier that changes a phase of the output voltage of the temperature variable voltage generating circuit proportional to temperature.

The amplifier may include an OP amp including a positive input end electrically connected to the reference voltage, a negative input end and an output end; a first resistance electrically connected to the negative input end of the OP amp and the output end of the temperature variable voltage generating circuit; and a second resistance electrically connected to the negative input end of the OP amp and the output end of the OP amp.

The variable voltage generating circuit may further include a regulator electrically connected to the output end of the amplifier and the reference resistance.

The apparatus may further include a buffer electrically connected to the other end portion of the reference resistance and the signal processor.

According to an exemplary embodiment of the present invention, it is possible to compensate error depending on temperature of resistance and reduce complication of the apparatus for measuring resistance value.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
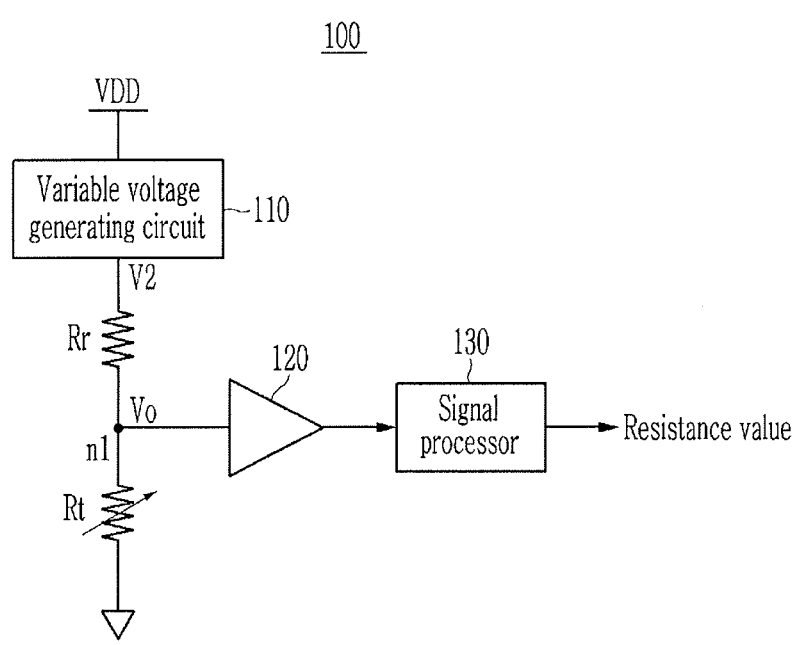
FIG. 1 is a schematic diagram illustrating an apparatus for measuring resistance value according to an exemplary embodiment of the present invention.

It may be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is intended to cover not only the exemplary embodiments, but also various alternatives, modifications, equivalents and other embodiments, which may be included within the spirit and scope of the invention as defined by the appended claims.

Exemplary embodiments of Exemplary embodiments of the present application will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In describing the present invention, parts that are not related to the description will be omitted. Like reference numerals designate like elements throughout the specification. Accordingly, reference numerals for elements illustrated in a previous drawing may be used in a following drawing.

Further, the size and thickness of each component shown in the drawings are arbitrarily shown for better understanding and ease of description, but the present invention is not limited thereto. In the drawings, the thickness of layers, films, panels, regions, etc., are exaggerated for clarity.

Electrically connecting two elements includes not only directly connecting two elements but also connecting two elements with other element therebetween. The other element may include a switch, a resistor, a capacitor, etc. In describing exemplary embodiments, expression of being connected to something, when there is no expression of being directly connected thereto, device being electrically connected thereto.

Hereinafter, an apparatus for measuring resistance value according to an exemplary embodiment will be described in detail with reference to the accompanying necessary drawings.

Figure 2:
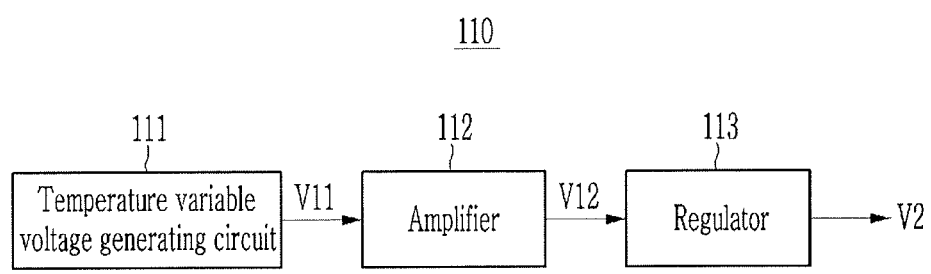
FIG. 2 is a block diagram illustrating a variable voltage supply circuit according to an exemplary embodiment of the present invention.

FIG. 1 is a schematic diagram illustrating an apparatus for measuring resistance value according to an exemplary embodiment of the present invention. FIG. 2 is a block diagram illustrating a variable voltage supply circuit according to an exemplary embodiment of the present invention.

Referring to FIG. 1, an apparatus for measuring resistance value according to an exemplary embodiment of the present invention may include a variable voltage generating circuit 110, a reference resistance Rr, a buffer 120 and a signal processor 130.

The reference resistance Rr includes one end portion supplied with voltage V2 for measuring resistance value and the other end portion electrically connected to a target resistance Rt. The target resistance Rt is electrically connected to the reference resistance Rr and ground. Accordingly, voltage V2 supplied to the reference resistance Rr is divided into the reference resistance Rr and the target resistance Rt, and voltage Vo corresponding to resistance value of the target resistance Rt is supplied to a connection node n1 (hereinafter, will be referred as 'output node') between the other end portion of the reference resistance Rr and the target resistance Rt.

The buffer 120 is disposed between the output node n1 and the signal processor 130 and electrically connected to the output node n1 and the signal processor 130. And the buffer 120 transmits the output voltage Vo of the output node n1 to the signal processor 130.

When the signal processor 130 receives the output voltage Vo from the buffer 120, the signal processor 130 transforms the output voltage Vo corresponding to resistance value and outputs the resistance value.

The resistance value of the reference resistance Rr is changed in accordance with temperature. When the resistance value of the reference resistance Rr is changed, the output voltage Vo of the output node n1 is changed such that error for measuring resistance value may occur.

Following equation 1 shows a variation of the output voltage Vo in accordance with a variation of the resistance value of the reference resistance Rr.

$$Vo = \frac{V2 \cdot Rt}{Rr(1 + \alpha \cdot T) + Rt} \qquad \text{[equation 1]}$$

Herein, the V2 denotes a voltage supplied to the reference resistance Rr, and the Vo denotes a voltage supplied to the output node n1, i.e., a node between the reference resistance Rr and the target resistance Rt. Further, α denotes a temperature coefficient of the reference resistance Rr, and T denotes ambient temperature of the reference resistance Rr, i.e., an internal temperature of the apparatus for measuring resistance value 100.

In above equation 1, the target resistance Rt is disposed outside of the apparatus for measuring resistance value 100 and is measuring object. And it is assumed that resistance value of the target resistance Rt is irrelevant to a variation of an internal temperature of the apparatus for measuring resistance value 100.

Referring to the equation 1, resistance value of the reference resistance Rr is Rr (1+α·T), and is increased as temperature is increased. Accordingly, although the target resistance Rt is same, the output voltage Vo supplied to the output node n1 is changed depending on temperature. According to the equation 1, the output voltage Vo may be changed about 5% or more depending on temperature.

According to an exemplary embodiment of the present invention, to compensate the variation of the resistance value of the reference resistance Rr, voltage V2 supplied to the reference resistance Rr is changed depending on temperature.

The variable voltage generating circuit 110 is disposed between a voltage source VDD and the reference resistance Rr, and is electrically connected to the voltage source VDD and the reference resistance Rr. The variable voltage generating circuit 110 changes a fixed voltage supplied from the voltage source VDD in accordance with temperature and outputs to the reference resistance Rr.

Referring to FIG. 2, the variable voltage generating circuit 110 may include a temperature variable voltage generating circuit 111, an amplifier 112 and a regulator 113.

The temperature variable voltage generating circuit 111 is electrically connected to the voltage source VDD, and changes the fixed voltage supplied from the voltage source VDD in accordance with temperature.

A power supply circuit of an electronic device includes a bandgap reference circuit supplying a reference voltage independent of temperature. The bandgap reference circuit includes a Proportional to absolute temperature (PTAT) circuit in which an output voltage proportional to absolute temperature is outputted and a complementary to absolute temperature (CTAT) circuit in which an output voltage inversely proportional absolute temperature is outputted, and outputs the reference voltage independent of temperature by appropriately summing the output voltages of the PTAT circuit and the CTAT circuit using coefficients.

The CTAT circuit included in power supply circuit supplying operation voltage VDD to the apparatus for measuring resistance value 100 may be used as the temperature variable voltage generating circuit 111. In the instant case, the temperature variable voltage generating circuit 111 may output voltage V11 inversely proportional to temperature. When the CTAT circuit included in the power supply circuit is used as the temperature variable voltage generating circuit 111, addition parts or circuits are not necessary to realize the temperature variable voltage generating circuit 111.

The amplifier 112 amplifies the output voltage V11 of the temperature variable voltage generating circuit 111 depending on an amplification rate (G). In a case that the temperature variable voltage generating circuit 111 is the CTAT circuit, the amplifier 112 changes a phase of the output voltage of the temperature variable voltage generating circuit 111 and outputs the phase-changed output voltage.

Figure 3:
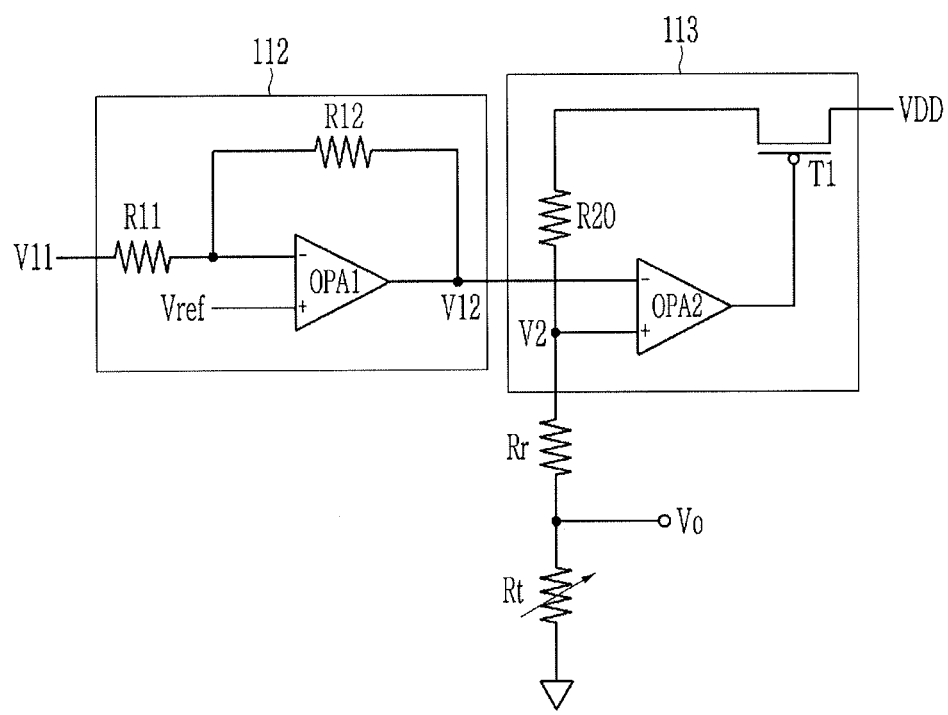
FIG. 3 is a circuit diagram illustrating a portion of a variable voltage supply circuit according to an exemplary embodiment of the present invention.

Referring to FIG. 3, the amplifier 112 may be an inverting amplifier, and include an OP amp OPA1, a resistance RH disposed between the OP amp OPA1 and the temperature variable voltage generating circuit 111 and electrically connected to a negative input end of the OP amp OPA1 and an output end of the temperature variable voltage generating circuit 111, and a resistance R12 electrically connected to the negative input end of the OP amp OPA1 and the output end of the OP amp OPA1. A reference voltage Vref is supplied to a positive input end of the OP amp OPA1.

The inverting amplifier 112 inverts the phase of the output voltage V11 and outputs the phase-changed output voltage V11. Accordingly, the output voltage V11 inversely proportional to temperature is transformed as voltage V12 proportional to temperature by the amplifier 112.

The amplification rate (G) of the inverting amplifier 112 is determined by the resistances R11 and R12. In the exemplary embodiment of the present invention, the resistance value of the resistances R11 and R12 is determined considering resistance value of the reference resistance Rr, temperature coefficient of the reference resistance Rr and temperature variation coefficient of voltage, and the amplification rage (G) of the inverting amplifier 112 is determined by the resistances R11 and R12.

Referring to FIG. 2, the regulator 113 uniformly maintains output voltage V12 of the amplifier 112. An output end of the regulator 113 is electrically connected to the reference resistance Rr, and output voltage V2 of the regulator 113 outputs to the reference resistance Rr.

Referring to FIG. 3, the regulator 113 may include an OP amp OPA2, a transistor T1 and resistance R20. The transistor T1 is a p-channel Field Effect Transistor (FET), and a source terminal and a drain terminal of the transistor T1 are electrically connected to the voltage source VDD and the resistance R20 respectively. Further, a gate terminal of the transistor T1 is electrically connected to an output end of the OP amp OPA2. A negative input end of the OP amp OPA2 is electrically connected to the output end of the amplifier 112, and a positive input end of the OP amp OPA2 is electrically connected to the drain terminal of the transistor T1 through the resistance R20. Further, the positive input end of the OP amp OPA2 is electrically connected to the reference resistance Rr, and voltage V2 of the positive input end of the OP amp OPA2 is supplied to the reference resistance Rr.

The variable voltage generating circuit 110 may output changed voltage V2 depending on temperature to the reference resistance Rr as following equation 2.

$$V2 = V1 + \beta \cdot T \cdot G \quad \text{[equation 2]}$$

Herein, the V1 denotes an input voltage of the variable voltage generating circuit 110 (VDD of FIG. 1), the β denotes a temperature variation coefficient of voltage, the T denotes temperature, and the G denotes the amplification of the amplifier 112.

When the equation 2 is substituted to the equation 1, the equation 1 is expressed as following equation 3.

$$Vo = \frac{V2 \cdot Rt}{Rr(1 + \alpha \cdot T) + Rt} = \frac{(V1 + \beta \cdot T \cdot G) \cdot Rt}{Rr(1 + \alpha \cdot T) + Rt} \quad \text{[equation 3]}$$

According to the equation 3, when the G is appropriately determined, resistance variation of the reference resistance in denominator can be compensated by the variable voltage V2.

Figure 4:
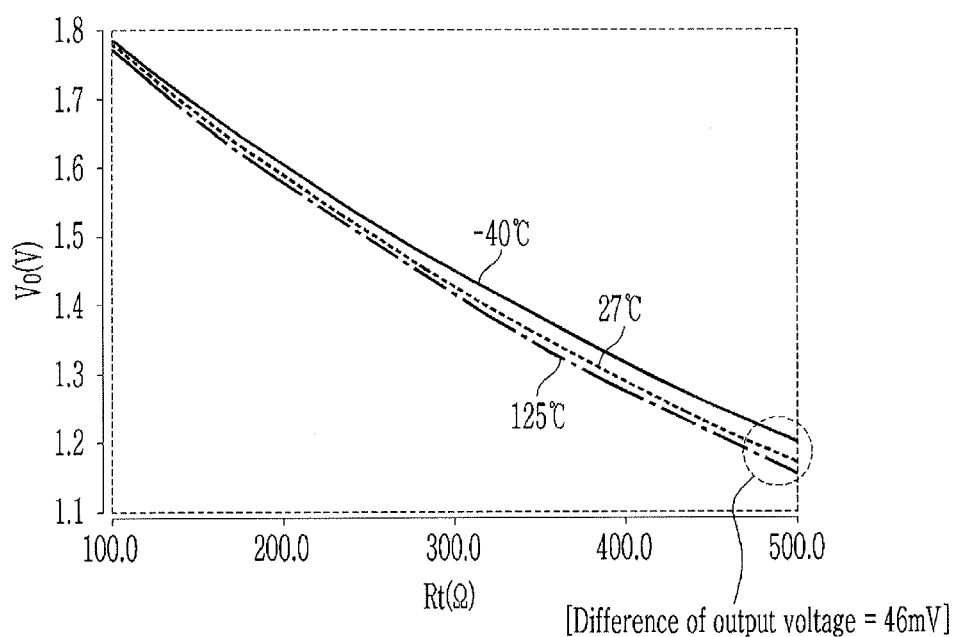
FIG. 4 is a graph illustrating measured resistance without temperature compensation using a variable voltage generating circuit.
Figure 5:
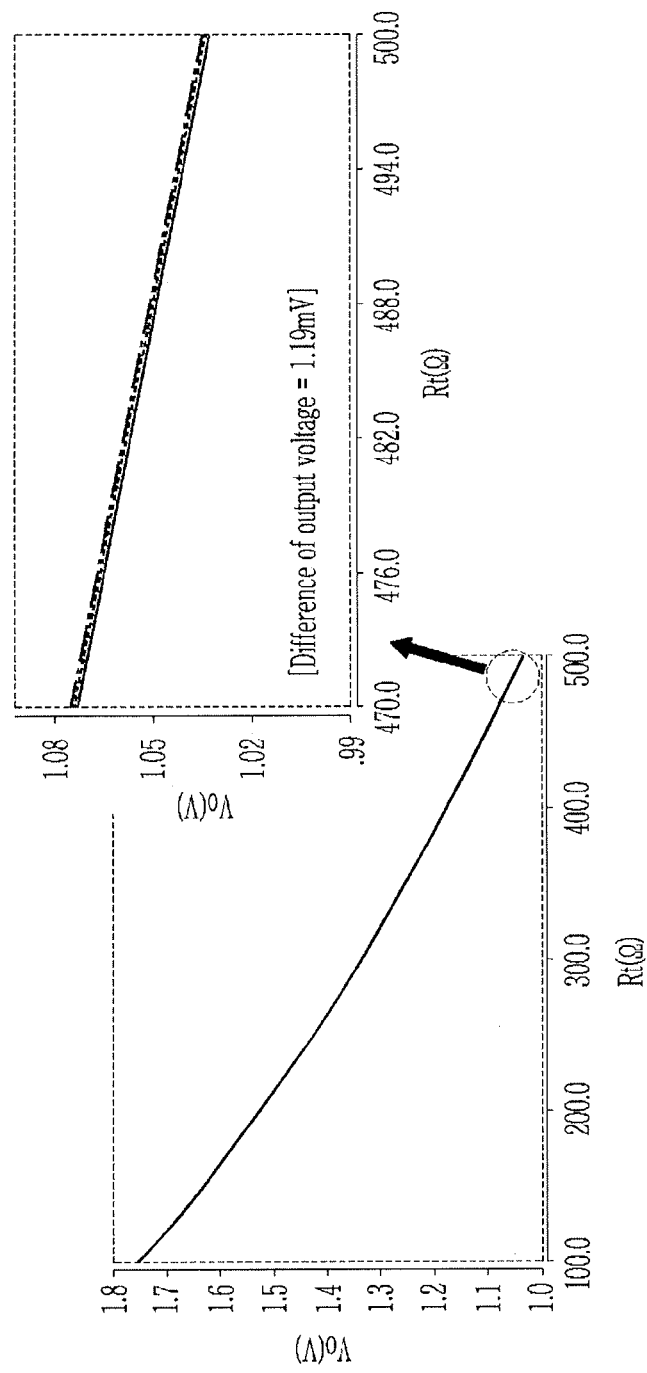
FIG. 5 is a graph illustrating measured resistance performing temperature compensation using a variable voltage generating circuit.

FIG. 4 and FIG. 5 are drawings for explaining effect of the apparatus for measuring resistance value. FIG. 4 is a graph illustrating measured resistance without temperature compensation using a variable voltage generating circuit. FIG. 5 is a graph illustrating measured resistance performing temperature compensation using a variable voltage generating circuit.

In FIG. 4 and FIG. 5, X axis denotes resistance value of the target resistance Rt, and Y axis denotes the output voltage Vo of the output node between the reference resistance Rr and the target resistance Rt.

Referring to FIG. 4, difference of the output voltage Vo is maximum 46 mV in accordance with ambient temperature without temperature compensation using the variable voltage generating circuit.

In the contrary, referring to FIG. 5, when the variable voltage generating circuit 110 is applied to and the amplification G of the amplifier 112 is set to 0.23, difference of the output voltage Vo is reduced to maximum 1.19 mV with respect to same target resistance Rt. That is, error depending on temperature is compensated.

As described above, according to an exemplary embodiment of the present invention, since voltage supplied to the reference resistance Rr is varied, measuring error of resistance in which is generated by temperature of the reference resistance Rr can be prevent. Further, since characteristic variation of the reference resistance Rr depending on temperature can be compensated by use of simple analog circuit, the measuring circuit is simplified and manufacturing cost of the measuring circuit is reduced comparing to the conventional art.

The above detailed descriptions with reference to the accompanying drawings are provided to assist in comprehensive understanding of exemplary embodiment of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Therefore, the scope of the present invention shall be determined only according to the attached claims and the equivalents thereof.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described to explain certain principles of the invention and their practical application, to enable others skilled in the art to make and utilize various exemplary embodiments of the present invention, as well as various alternatives and modifications thereof. It is intended that the scope of the invention be defined by the Claims appended hereto and their equivalents.

What is claimed is:

1. An apparatus for measuring resistance value, the apparatus comprising:
    a reference resistance including a first end portion supplied with a first voltage and a second end portion connected to a target resistance;
    a variable voltage generating circuit for generating the first voltage varied according to temperature and supplying the first voltage to the first end portion of the reference resistance; and
    a signal processor for outputting resistance of the target resistance corresponding to a voltage outputted to the second end portion of the reference resistance,
    wherein the variable voltage generating circuit includes:
        a temperature variable voltage generating circuit for varying a second voltage in accordance with temperature and outputting the second voltage; and
        an amplifier for amplifying an output voltage of the temperature variable voltage generating circuit to the first voltage and outputting the first voltage.

2. The apparatus of claim 1, further including:
    a bandgap reference circuit supplying the second voltage,
    wherein the temperature variable voltage generating circuit is a complementary to absolute temperature (CTAT) circuit of the bandgap reference circuit.

3. The apparatus of claim 2, wherein the temperature variable voltage generating circuit outputs a voltage inversely proportional to the temperature.

4. The apparatus of claim 3, wherein the amplifier is an inverting amplifier that changes a phase of the output voltage of the temperature variable voltage generating circuit proportional to the temperature.

5. The apparatus of claim 4, wherein the amplifier includes:
    an OP amp including a positive input end electrically connected to the reference voltage, a negative input end and an output end;
    a first resistance electrically connected to the negative input end of the OP amp and the output end of the temperature variable voltage generating circuit; and
    a second resistance electrically connected to the negative input end of the OP amp and the output end of the OP amp.

6. The apparatus of claim 1, wherein the variable voltage generating circuit further includes a regulator electrically connected to the output end of the amplifier and the reference resistance.

7. The apparatus of claim 1, further including:
    a buffer electrically connected to the second end portion of the reference resistance and the signal processor.

* * * * *